(12) United States Patent
Lee (10) Patent No.: US 12,457,694 B2
(45) Date of Patent: Oct. 28, 2025

(54) MULTILAYER CIRCUIT BOARD MANUFACTURING APPARATUS AND MULTILAYER CIRCUIT BOARD MANUFACTURING METHOD

(71) Applicant: HAESUNG DS CO., LTD., Gyeongsangnam-do (KR)

(72) Inventor: Sang Min Lee, Gyeongsangnam-do (KR)

(73) Assignee: HAESUNG DS CO., LTD., Gyeongsangnam-Do (KR)

( * ) Notice: Subject to any disclaimer, the term of this patent is extended or adjusted under 35 U.S.C. 154(b) by 433 days.

(21) Appl. No.: 17/935,340

(22) Filed: Sep. 26, 2022

(65) Prior Publication Data

US 2023/0095254 A1   Mar. 30, 2023

(30) Foreign Application Priority Data

Sep. 30, 2021   (KR) .......................... 10-2021-0130305

(51) Int. Cl.
*H05K 3/46* (2006.01)
(52) U.S. Cl.
CPC ..... *H05K 3/4611* (2013.01); *H05K 2203/068* (2013.01)
(58) Field of Classification Search
CPC ..... H05K 2201/0195; H05K 2203/068; H05K 2203/1545; H05K 3/281; H05K 3/4611
See application file for complete search history.

(56) References Cited

U.S. PATENT DOCUMENTS

| RE26,374 E * | 4/1968 | Beery ...................... F24D 13/02 |
| | | 156/308.2 |
| 4,389,438 A * | 6/1983 | Ohtsuki .................. B32B 37/02 |
| | | 156/334 |
| 4,659,425 A * | 4/1987 | Eggers ...................... B32B 15/14 |
| | | 156/324 |
| 2020/0406573 A1 | 12/2020 | Huhtasalo et al. |
| 2021/0207322 A1 | 7/2021 | Biegelsen et al. |
| 2023/0095254 A1 * | 3/2023 | Lee ......................... H05K 3/281 |
| | | 156/285 |

FOREIGN PATENT DOCUMENTS

| JP | 2009253045 | 10/2009 |
| JP | 5174637 | 4/2013 |
| KR | 20180083096 | 7/2018 |
| TW | 202029847 | 8/2020 |

OTHER PUBLICATIONS

Patent Family for Application.*
Patent Registration for KR20210130305.*
Written Opinion for KR20210130305.*
Translation of JPH07290572.*

* cited by examiner

*Primary Examiner* — Sonya M Sengupta
(74) *Attorney, Agent, or Firm* — Perman & Green, LLP (57) ABSTRACT

Disclosed are a multilayer circuit board manufacturing apparatus and a multilayer circuit board manufacturing method. The present disclosure includes: a plurality of uncoilers configured to supply a plurality of different members; and a compressing machine configured to bond the members, which are supplied from the respective uncoilers, to each other. The compressing machine includes: a belt that rotates in contact with one surface of one of the plurality of members; and a pressing device which is located inside the belt and spaced apart from the belt, and presses the belt toward the member in a non-contact manner.

10 Claims, 7 Drawing Sheets

MULTILAYER CIRCUIT BOARD MANUFACTURING APPARATUS AND MULTILAYER CIRCUIT BOARD MANUFACTURING METHOD

CROSS-REFERENCE TO RELATED APPLICATION

This application is based on and claims priority under 35 U.S.C. § 119 to Korean Patent Application No. 10-2021-0130305, filed on Sep. 30, 2021, in the Korean Intellectual Property Office, the disclosure of which is incorporated by reference herein in its entirety.

BACKGROUND

1. Field

One or more embodiments relate to an apparatus and a method, and more particularly, to a multilayer circuit board manufacturing apparatus and a multilayer circuit board manufacturing method.

2. Description of the Related Art

With the development of electronic or communication technology, electronic/communication devices, such as mobile phones, are gradually becoming smaller and higher in performance. Accordingly, circuit boards embedded in the electronic/communication devices are being manufactured as multilayer circuit boards to perform many functions.

The multilayer circuit boards may be manufactured through a roll press method. For example, the multilayer circuit boards may be manufactured through a roll-to-roll stacking method using a plurality of rollers.

Such a multilayer circuit board has a structure in which composite materials are stacked. When manufactured through the roll-to-roll method, the composite materials may be transferred and compressed while tension is applied thereto. Here, in order to attach the composite materials to each other, it is necessary to apply pressure while applying heat. In this case, the multilayer circuit board manufactured by providing uniform pressure and temperature to the composite materials may not cause product quality defects such as poor appearance.

SUMMARY

One or more embodiments include a multilayer circuit board manufacturing apparatus and a multilayer circuit board manufacturing method, which can manufacture a high quality multilayer circuit board through a roll-to-roll method.

Additional aspects will be set forth in part in the description which follows and, in part, will be apparent from the description, or may be learned by practice of the presented embodiments of the disclosure.

According to one or more embodiments, a multilayer circuit board manufacturing apparatus includes: a plurality of uncoilers configured to supply a plurality of different members; and a compressing machine configured to bond the members, which are supplied from the respective uncoilers, to each other, wherein the compressing machine includes: a belt that rotates in contact with one surface of one of the plurality of members; and a pressing device which is located inside the belt and spaced apart from the belt, and presses the belt toward the member in a non-contact manner.

In the embodiment, the compressing machine may further include a belt roller which is located inside the belt and rotates the belt.

In the embodiment, the pressing device may include: a fluid pressing unit configured to supply a fluid toward the belt; and a fluid outlet which is located adjacent to the fluid pressing unit and collects the fluid.

In the embodiment, the pressing device may include a fluid inlet which is connected to the fluid pressing unit and guides the fluid to the fluid pressing unit.

In the embodiment, the fluid inlet may be provided in plurality, and the plurality of fluid inlets may be connected to the fluid pressing unit and spaced a certain distance from each other.

In the embodiment, the multilayer circuit board manufacturing apparatus may further include a recoiler configured to wind a multilayer circuit board in which the plurality of members passing through the compressing machine are laminated.

In the embodiment, the multilayer circuit board manufacturing apparatus may further include a curing device configured to cure the multilayer circuit board that is wound around the recoiler.

In the embodiment, the curing device may include: an oven in which the multilayer circuit board wound around the recoiler is located; a support which is located inside the oven and supports the multilayer circuit board; and a heating section which is located in the oven and provides heat to the multilayer circuit board.

In the embodiment, the curing device may include: an unwinding roller which the multilayer circuit board wound around the recoiler is disposed on and unwound from; a heating unit configured to heat the multilayer circuit board that is unwound from the unwinding roller; and a winding roller configured to wind the multilayer circuit board that has passed through the heating unit.

In the embodiment, the heating unit may include: a heating chamber configured to provide a space in which the multilayer circuit board moves; and a heating portion which is located inside the heating chamber and heats the multilayer circuit board.

According to one or more embodiments, a multilayer circuit board manufacturing method includes: unwinding each of a plurality of members; laminating the plurality of members in a compressing machine; and applying heat to the plurality of laminated members in a curing device to fix the same.

In the embodiment, the compressing machine may include: a belt that rotates in contact with one surface of one of the plurality of members; and a pressing device which is located inside the belt and spaced apart from the belt, and presses the belt toward the member in a non-contact manner.

In the embodiment, the pressing device may include: a fluid pressing unit configured to supply a fluid toward the belt; and a fluid outlet which is located adjacent to the fluid pressing unit and collects the fluid.

In the embodiment, the multilayer circuit board manufacturing method may further include winding the plurality of laminated members.

In the embodiment, the curing device may include: an oven in which a multilayer circuit board wound around a recoiler is located; a support which is located inside the oven and supports the multilayer circuit board; and a heating section which is located in the oven and provides heat to the multilayer circuit board.

In the embodiment, the curing device may include: an unwinding roller which the multilayer circuit board wound around a recoiler is disposed on and unwound from; a heating unit configured to heat the multilayer circuit board that is unwound from the unwinding roller; and a winding roller configured to wind the multilayer circuit board that has passed through the heating unit.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The present disclosure will be clarified through following embodiments described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims. Meanwhile, the terms used in this specification are used only to explain embodiments while not limiting the present disclosure. In this specification, the singular forms include the plural forms as well, unless the context clearly indicates otherwise. The meaning of "comprises" and/or "comprising" used in the specification does not exclude the presence or addition of one or more components, steps, operations, and/or elements other than the mentioned components, steps, operations, and/or elements. It will be understood that although the terms of first and second are used herein to describe various elements, these elements should not be limited by these terms. Terms are only used to distinguish one component from other components.

Figure 1:
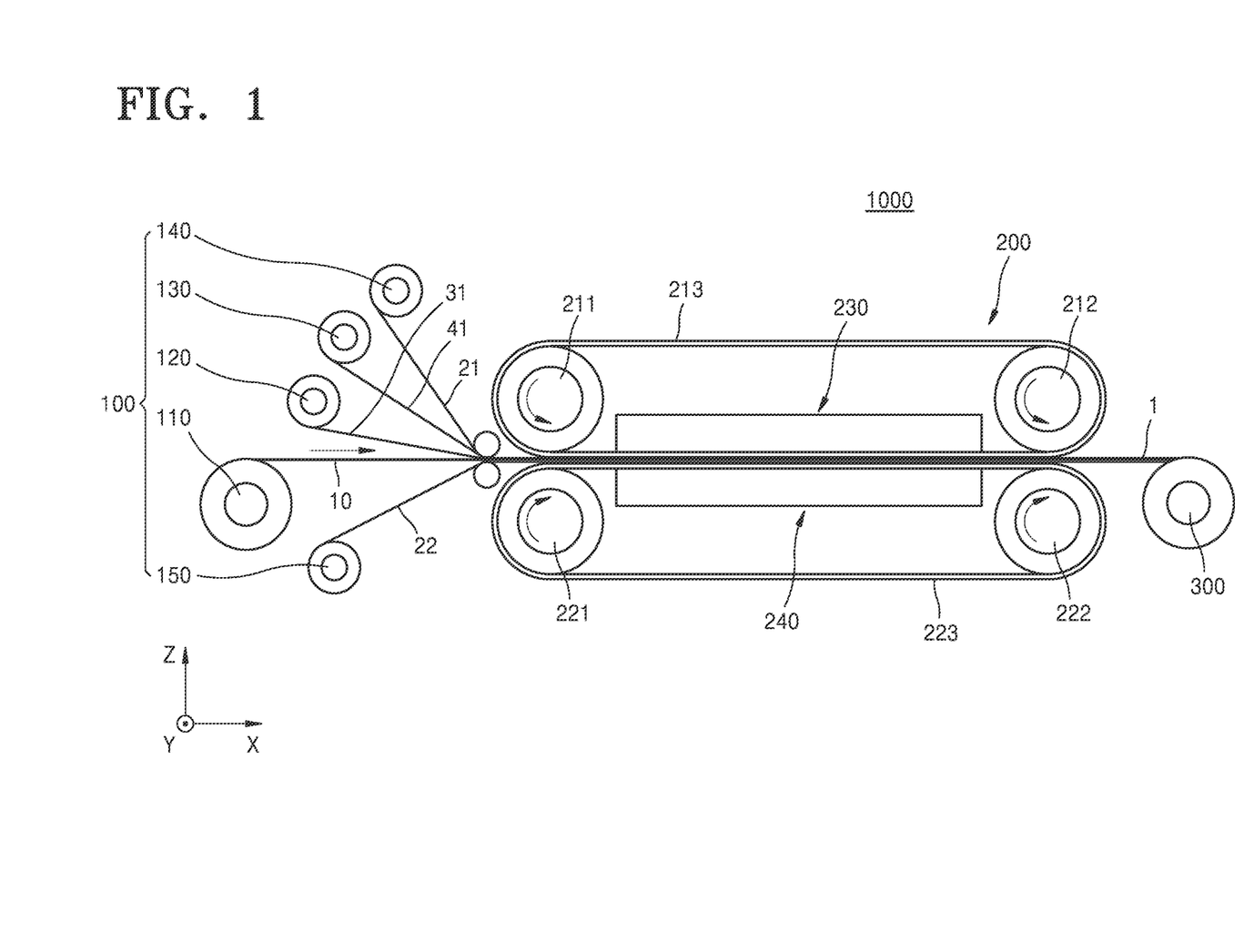
FIG. 1 is a front view showing a portion of a multilayer circuit board manufacturing apparatus according to an embodiment of the present disclosure.
Figure 2:
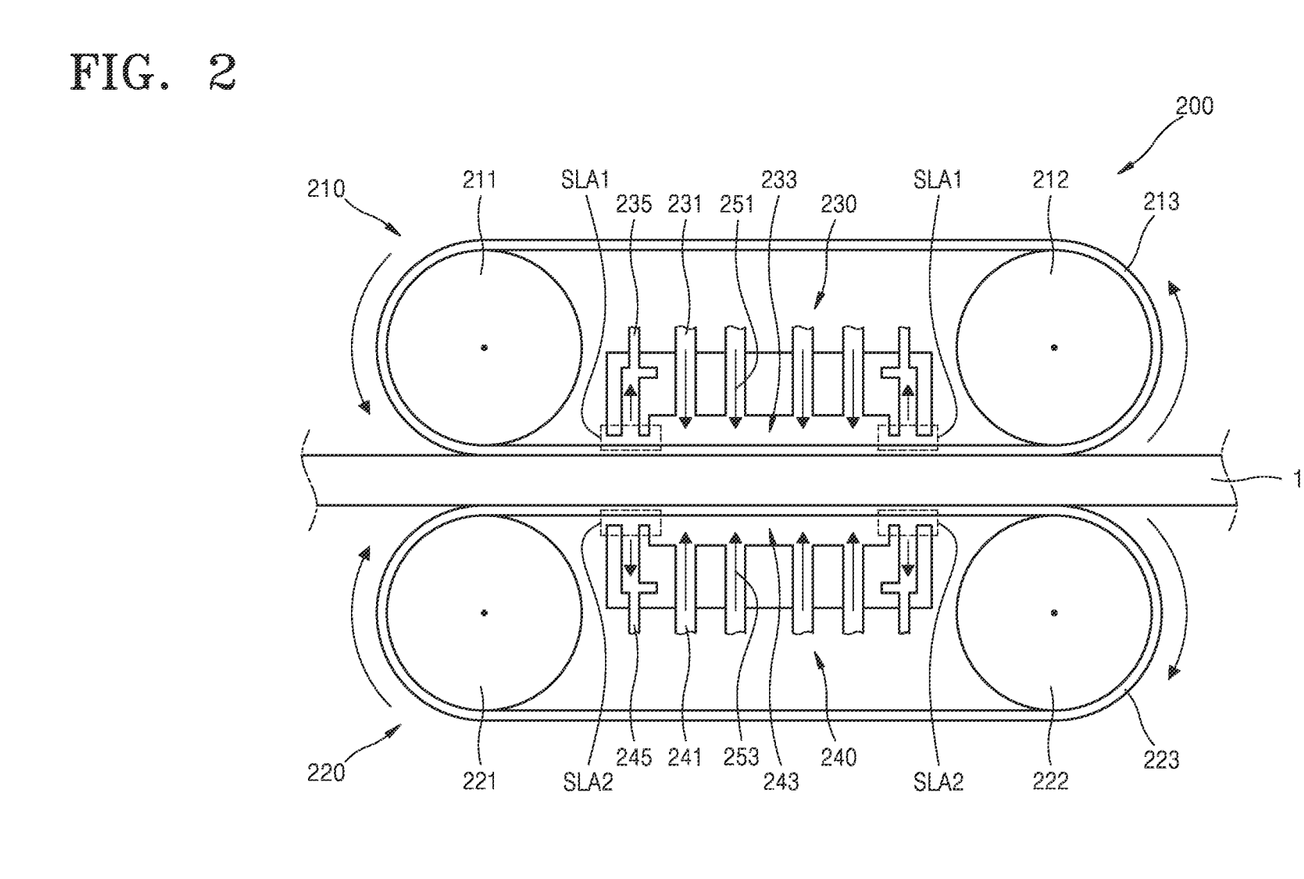
FIG. 2 is a front view showing a pressing unit illustrated in FIG. 1.
Figure 3:
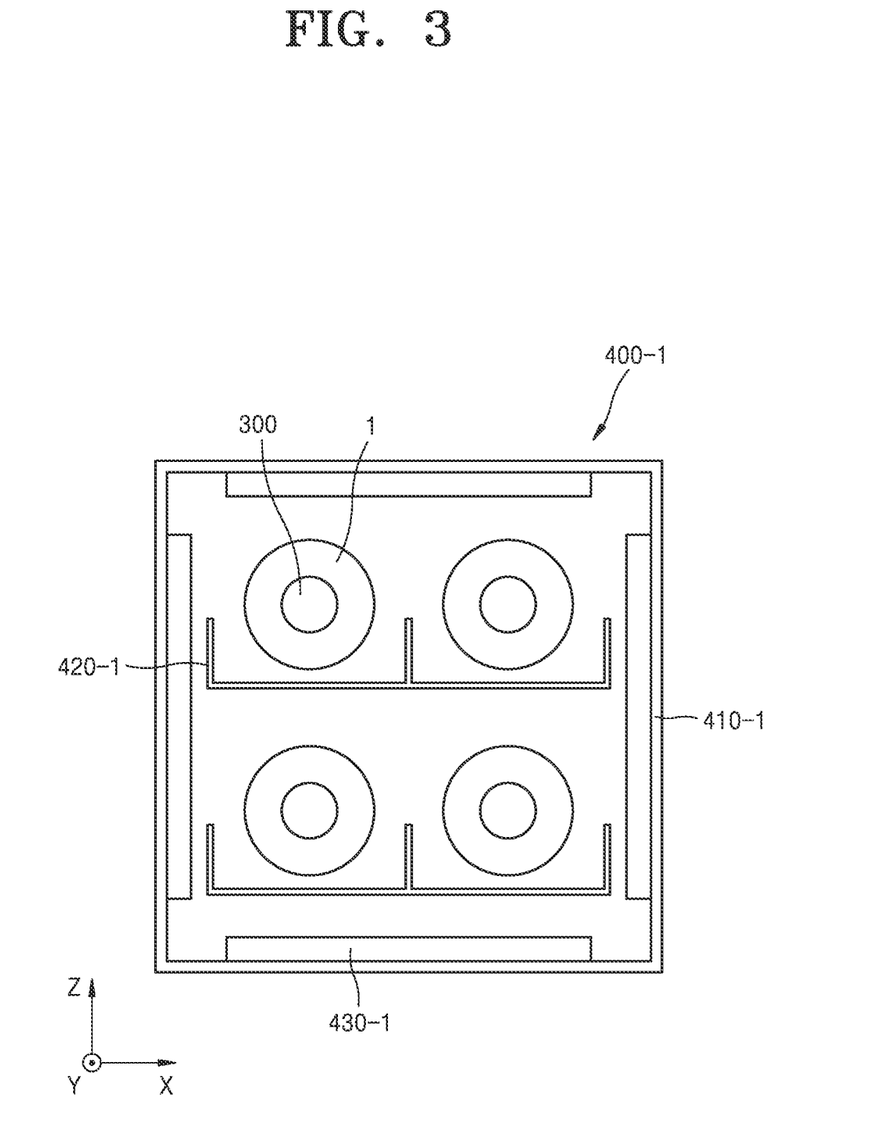
FIG. 3 is a front view showing another portion of the multilayer circuit board manufacturing apparatus according to an embodiment of the present disclosure.

FIG. 1 is a front view showing a portion of a multilayer circuit board manufacturing apparatus according to an embodiment of the present disclosure. FIG. 2 is a front view showing a pressing unit illustrated in FIG. 1. FIG. 3 is a front view showing another portion of the multilayer circuit board manufacturing apparatus according to an embodiment of the present disclosure.

Referring to FIGS. 1 to 3, a multilayer circuit board manufacturing apparatus 1000 may manufacture a multilayer circuit board 1. The multilayer circuit board manufacturing apparatus 1000 may include an uncoiler 100, a compressing machine 200, and a recoiler 300.

The uncoiler 100 may include a central uncoiler 110, a first uncoiler 140, a second uncoiler 150, a third uncoiler 120, and a fourth uncoiler 130. Here, although not illustrated in the drawings, the uncoiler 100 may bend at least one of materials at least twice.

The central uncoiler 110 may continuously supply central material 10. The first uncoiler 140 may supply a first material 21. The second uncoiler 150 may supply a second material 22. The third uncoiler 120 may supply a third material 31. The fourth uncoiler 130 may supply a fourth material 41. The uncoiler 100 may be an un-coiler that supplies materials and may adjust tension of each of the materials.

The compressing machine 200 may compress the central material 10 and the plurality of materials. In an embodiment, the compressing machine 200 may compress the second material 22, the central material 10, and the first material 21 which are arranged in this order. In an embodiment, the compressing machine 200 may compress the second material 22, the central material 10, the third material 31, the fourth material 41, and the first material 21, which are arranged in this order. The compressing machine 200 may include a first belt device 210, a second belt device 220, a first pressing device 230, and a second pressing device 240.

The first belt device 210 and the second belt device 220 may be disposed facing each other with the multilayer circuit board 1 therebetween. The first belt device 210 and the second belt device 220 may allow the multilayer circuit board 1 to pass through between the first belt device 210 and the second belt device 220. The first belt device 210 may include a first belt roller 211, a second belt roller 212, and a first belt 213. The second belt device 220 may include a third belt roller 221, a fourth belt roller 222, and a second belt 223. The first belt 213 and the second belt 223 may rotate, and may move the multilayer circuit board 1 in one direction. Here, the first belt 213 and the second belt 223 may be arranged in the form similar to a caterpillar track, and may be formed to close the inner space from the outside. The first belt 213 and the second belt 223 may include steel. For example, the first belt 213 and the second belt 223 may include stainless steel, a nickel alloy, or a nickel-chromium alloy.

The first belt roller 211 and the second belt roller 212 are spaced apart from each other and may rotate the first belt 213. Each of the first belt roller 211 and the second belt roller 212 may be connected to a driving unit, such as a motor, and may be controlled and rotated by the driving unit.

The third belt roller 221 and the fourth belt roller 222 are spaced apart from each other and may rotate the second belt 223. Each of the third belt roller 221 and the fourth belt roller 222 may be connected to a driving unit, such as a motor, and may be controlled and rotated by the driving unit.

In an embodiment, the first belt roller 211 and the third belt roller 221 may face each other with the multilayer circuit board 1 therebetween, and the second belt roller 212 and the fourth belt roller 222 may face each other with the multilayer circuit board 1 therebetween.

The first pressing device 230 and the second pressing device 240 may press the multilayer circuit board 1. The first pressing device 230 may be located between the first belt roller 211 and the second belt roller 212. The first pressing device 230 may press the first belt 213. The first pressing device 230 may include a first fluid inlet 231, a first fluid pressing unit 233, and a first fluid outlet 235. The first fluid inlet 231 may be connected to a first fluid supply unit (not shown). In an embodiment, the first fluid inlet 231 may be a first pipe. The first fluid supply unit may store a first fluid 251 of high temperature and high pressure. In an embodiment, the first fluid 251 may be an high-temperature and high-pressure oil. The first fluid 251 may move to the first fluid pressing unit 233 via the first fluid inlet 231. The first fluid 251 may press the first belt 213 in the first fluid pressing unit 233. Also, the first fluid 251 may transfer heat to the multilayer circuit board 1 in the first fluid pressing unit 233. The first fluid pressing unit 233 may be a space capable of accommodating the first fluid 251. The first fluid outlet 235 may discharge the first fluid 251 from the first pressing device 230. In an embodiment, the first fluid outlet 235 may be connected to a fluid accommodation unit (not shown) in a vacuum state. A first slip region SLA1 may be formed between the first fluid pressing unit 233 and the first fluid outlet 235. The first slip region SLA1 may be a region in which slip between the first belt 213 and the first fluid pressing unit 230 occurs due to the first fluid 251. Therefore, the first belt 213 may slip over the first pressing device 230 and may rotate.

The second pressing device 240 may be located between the third belt roller 221 and the fourth belt roller 222. The second pressing device 240 may press the second belt 223. The second pressing device 240 may include a second fluid inlet 241, a second fluid pressing unit 243, and a second fluid outlet 245. The second fluid inlet 241 may be connected to a second fluid supply unit (not shown). In an embodiment, the second fluid inlet 241 may be a second pipe. The second fluid supply unit may store a second fluid 253 of high temperature and high pressure. In an embodiment, the second fluid 253 may be an high-temperature and high-pressure oil. The second fluid 253 may move to the second fluid pressing unit 243 via the second fluid inlet 241. The second fluid 253 may press the second belt 223 in the second fluid pressing unit 243. Also, the second fluid 253 may transfer heat to the multilayer circuit board 1 in the second fluid pressing unit 243. The second fluid pressing unit 243 may be a space capable of accommodating the second fluid 253. The second fluid outlet 245 may discharge the second fluid 253 from the second pressing device 240. In an embodiment, the second fluid outlet 245 may be connected to a fluid accommodation unit (not shown) in a vacuum state. A second slip region SLA2 may be formed between the second fluid pressing unit 243 and the second fluid outlet 245. The second slip region SLA2 may be a region in which slip between the second belt 223 and the second fluid pressing unit 240 occurs due to the second fluid 253. Therefore, the second belt 223 may slip over the second pressing device 240 and may rotate.

The recoiler 300 may wind the multilayer circuit board 1 that has passes through the first pressing device 230 and the second pressing device 240. In this case, at least one recoiler 300 may be provided. Also, when a plurality of recoilers 300 are provided, the plurality of recoilers 300 may sequentially wind the multilayer circuit board 1.

The recoiler 300 as described above is provided with a separate driving unit, such as a motor, and may rotate not only to wind the multilayer circuit board 1 but also to move the multilayer circuit board 1.

The multilayer circuit board manufacturing apparatus 1000 may further include a curing device 400-1. Here, the curing device 400-1 may be provided separately from the uncoiler 100, the compressing machine 200, and the recoiler 300. In this case, the curing device 400-1 may include: an oven 410-1 into which the multilayer circuit board 1 wound around the recoiler 300 is inserted; a support 420-1 which is located inside the oven 410-1 and supports the multilayer circuit board 1; and a heating section 430-1 which is located inside the oven 410-1 and provides heat. In this case, the support 420-1 is connected to a rotary shaft of the recoiler 300, and thus may support the multilayer circuit board 1 while not being in contact with the multilayer circuit board 1. In another embodiment, the multilayer circuit board 1 may be supported by being seated on the support 420-1. The heating section 430-1 may apply heat to the multilayer circuit board 1 in various ways. For example, the heating section 430-1 may heat the multilayer circuit board 1 by emitting light onto the multilayer circuit board 1. In another embodiment, the heating section 430-1 may include a heater. In another embodiment, the heating section 430-1 may heat the multilayer circuit board 1 by providing hot wind to the multilayer circuit board 1. A method for manufacturing the multilayer circuit board 1 using the multilayer circuit board manufacturing apparatus 1000 mentioned above will be described in detail.

The uncoiler 100 may continuously supply materials. The central uncoiler 110 may continuously supply the central material 10 and change the movement path of the continuously supplied central material 10 at least twice. In an embodiment, the central material 10 may include a core layer, a metal pattern, and a metal layer. The core layer may include a first surface and a second surface which are opposite to each other. The metal pattern may be disposed on at least one of the first surface and the second surface. For example, the metal pattern may be disposed on the first surface, and the metal layer may be disposed on the second surface.

The first uncoiler 140 may continuously supply the first material 21. The second uncoiler 150 may continuously supply the second material 22. In an embodiment, the first material 21 and the second material 22 may have the same substance.

The third uncoiler 120 may continuously supply the third material 31. In an embodiment, the third material 31 may include prepreg. The fourth uncoiler 130 may continuously supply the fourth material 41. The fourth material 41 may include a copper foil.

Subsequently, each of the materials may be fed into the compressing machine 200 at preset angles.

Next, the compressing machine 200 may compress the plurality of materials which are fed into the compressing machine 200. The plurality of materials may pass through between the first belt device 210 and the second belt device 220. The first belt 213 and the second belt 223 may rotate, and the plurality of materials may be moved in one direction.

The first pressing device 230 and the second pressing device 240 may compress the plurality of materials fed into the compressing machine 200. In an embodiment, the first fluid 251 supplied to the first pressing device 230 may be in a high temperature and high pressure state, and the second fluid 253 supplied to the second pressing device 240 may be in a high temperature and high pressure state. Thus, the plurality of materials fed into the compressing machine 200 may be compressed by the first fluid 251 and the second fluid 253. In an embodiment, the compressing machine 200 may compress the second material 22, the central material 10, and the first material 21 which are arranged in this order. In an embodiment, the compressing machine 200 may compress the second material 22, the central material 10, the third material 31, the fourth material 41, and the first material 21, which are arranged in this order. That is, the first fluid 251 and the second fluid 253 may heat the first belt 213 and the second belt 223 while pressing the first belt 213 and the second belt 223 toward the second material 22 and the first material 21, respectively. In this case, the first fluid 251 and the second fluid 253 may press various regions of the inner surfaces of the first belt 213 and the second belt 223, respectively, at uniform pressure. Also, the first belt 213 and the second belt 223 may apply pressure without being affected by the shape of the surface of at least one of the second material 22, the central material 10, the third material 31, the fourth material 41, and the first material 21. Therefore, in the above case, when the first belt 213 and the second belt 223 press the second material 22 and the first material 21, respectively, it is possible to minimize defects occurring during a process of bonding the second material 22, the central material 10, the third material 31, the fourth material 41, and the first material 21 due to non-uniform pressure on the pressing surface of each of the first belt 213 and the second belt 223. Also, not only can uniform pressure may be provided on the second material 22, the central material 10, the third material 31, the fourth material 41, and the first material 21, but also pressure applied to a specific portion may not be excessively greater than that of another portion. Therefore, it is possible to prevent damage to each material that may occur during the manufacture of the multilayer circuit board 1.

Subsequently, the manufactured multilayer circuit board 1 may pass through the compressing machine 200. Therefore, according to the present embodiment, it is possible to manufacture the multilayer circuit board 1 with reduced appearance defects and improved product quality.

When the above process is completed, the recoiler 300 may be inserted into the curing device 400-1. Here, the recoiler 300 may have shape that can be separated from a separately provided driving unit.

The curing device 400-1 may strengthen the coupling between the second material 22, the central material 10, the third material 31, the fourth material 41, and the first material 21 by supplying heat to the recoiler 300.

Thus, the multilayer circuit board manufacturing apparatus 1000 and the multilayer circuit board manufacturing method enable the manufacture of the multilayer circuit board 1 having the uniform quality. Also, the multilayer circuit board manufacturing apparatus 1000 and the multilayer circuit board manufacturing method may minimize defects that may occur during the manufacture of the multilayer circuit board 1.

Figure 4:
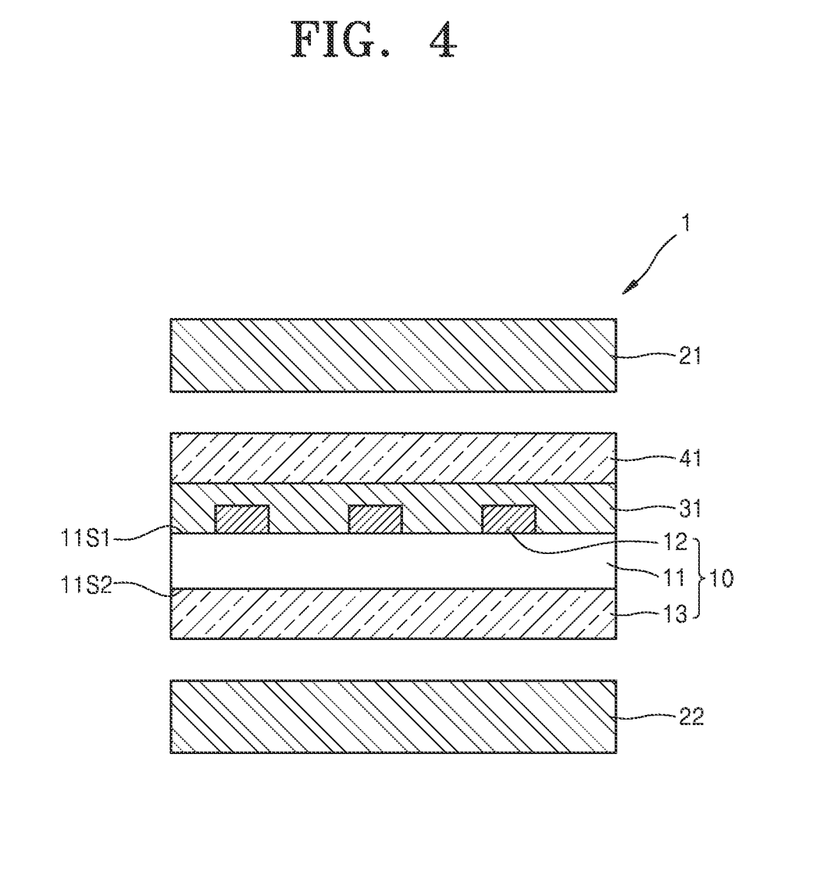
FIG. 4 is a cross-sectional view showing a multilayer circuit board according to an embodiment of the present disclosure.

FIG. 4 is a cross-sectional view showing a multilayer circuit board according to an embodiment of the present disclosure.

Referring to FIG. 4, the multilayer circuit board 1 may include the central material 10 and the plurality of materials. In an embodiment, the plurality of materials may include the central material 10, the first material 21, the second material 22, the third material 31, and the fourth material 41.

The second material 22, the central material 10, the third material 31, and the first material 21 may be disposed in this order in the multilayer circuit board 1. The multilayer circuit board 1 may be a circuit board which is manufactured for a component used for signal connection between electronic components in an electronic device.

The central material 10 may include a core layer 11, a metal pattern 12, and a metal layer 13. The core layer 11 may be a layer which is formed by impregnating a base material, such as a glass cloth or a glass non-woven fabric, with thermosetting resin and then curing the impregnated base material. The core layer 11 may include a first surface 11S1 and a second surface 11S2. The second surface 11S2 may be a surface on the opposite side from the first surface 11S1. The metal pattern 12 may be disposed on at least one of the first surface 11S1 and the second surface 11S2. For example, the metal pattern 12 may be disposed on the first surface 11S1, and the metal layer 13 may be disposed on the second surface 11S2. In another example, the metal pattern 12 may be disposed on the second surface 11S2, and the metal layer 13 may be disposed on the first surface 11S1. The metal pattern 12 may be a patterned metal thin plate having high conductivity, such as a copper (Cu) foil. The metal layer 13 may be a non-patterned metal thin plate having high conductivity, such as a copper foil. In some embodiments, the metal pattern 12 may be omitted, and the metal layer 13 may be disposed on each of the first surface 11S1 and the second surface 11S2.

The third material 31 may cover the metal pattern 12. The third material 31 may be disposed on the first surface 11S1 of the core layer 11 and the metal pattern 12. The third material 31 may be prepreg. For example, the third material 31 may be formed by impregnating a glass cloth or a glass non-woven fabric with thermosetting resin and then semi-curing the impregnated material. In some embodiments, when the metal pattern 12 is omitted, the third material 31 may be omitted.

The fourth material 41 may be disposed on the third material 31. In one embodiment, the fourth material 41 may be disposed on the side of the first surface 11S1 of the core layer 11. In some embodiments, the fourth material 41 may be a non-patterned metal thin plate having high conductivity, such as a copper foil. In some embodiments, the fourth material 41 may be omitted.

The first material 21 may be disposed on the fourth material 41. The first material 21 may be a cover foil. In one embodiment, the first material 21 may be a carrier made of a copper foil. The first material 22 may be disposed below the central material 10. In some embodiments, the central material 10 may be disposed between the first material 21 and the second material 22. In one embodiment, the second material 22 may be a carrier made of a copper foil. The first material 21 and the second material 22 may have the same substance.

The multilayer circuit board 1 as described above may have a structure in which composite materials are stacked. The first material 21 and the second material 22 may have the same substance and be arranged symmetrically.

Figure 5:
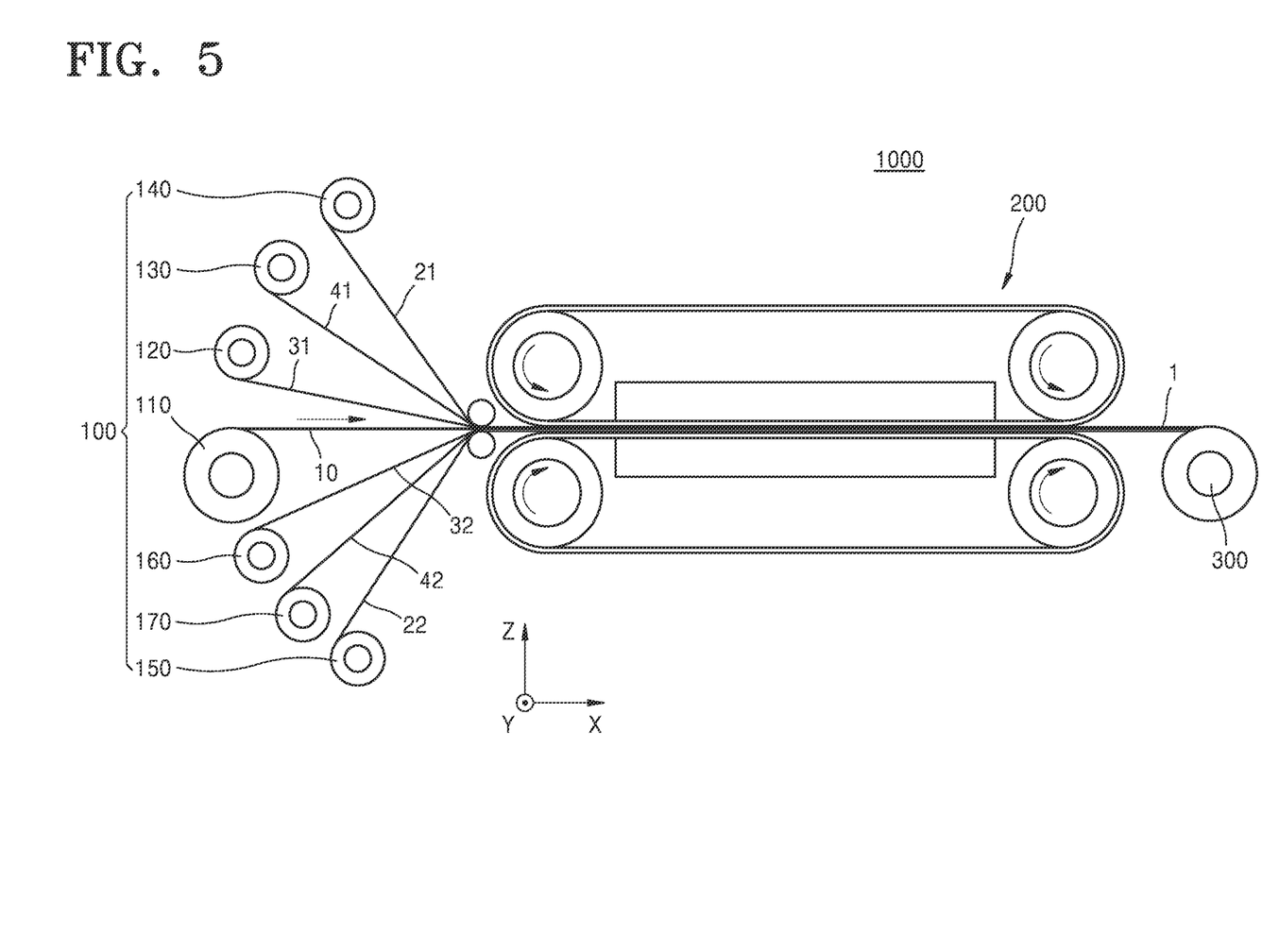
FIG. 5 is a front view showing a portion of a multilayer circuit board manufacturing apparatus according to another embodiment of the present disclosure.
Figure 6:
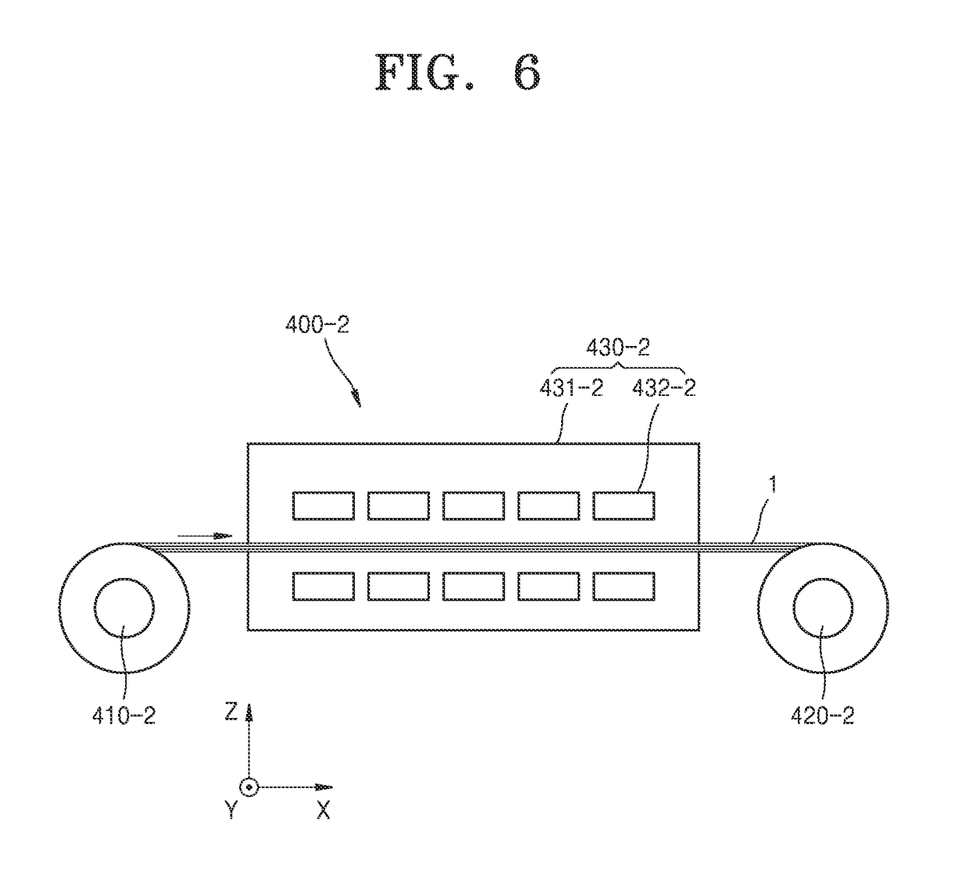
FIG. 6 is a front view showing another portion of the multilayer circuit board manufacturing apparatus according to another embodiment of the present disclosure.

FIG. 5 is a front view showing a portion of a multilayer circuit board manufacturing apparatus according to another embodiment of the present disclosure. FIG. 6 is a front view showing another portion of the multilayer circuit board manufacturing apparatus according to another embodiment of the present disclosure.

Referring to FIGS. 5 and 6, a multilayer circuit board manufacturing apparatus 1000 may manufacture a multilayer circuit board 1. The multilayer circuit board manufacturing apparatus 1000 may include an uncoiler 100, a compressing machine 200, and a recoiler 300. The uncoiler 100 may include a central uncoiler 110, a first uncoiler 140, a second uncoiler 150, a third uncoiler 120, a fourth uncoiler 130, a fifth uncoiler 160, and a sixth uncoiler 170.

The fifth uncoiler 160 may supply a fifth material 32. The sixth uncoiler 170 may supply a sixth material 42.

The compressing machine 200 may compress the central material 10 and the plurality of materials. Here, the compressing machine 200 may be the same as or similar to that illustrated in FIGS. 1 and 2. In an embodiment, the compressing machine 200 may compress the second material 22, the sixth material 42, the fifth material 32, the central material 10, the third material 31, the fourth material 41, and the first material 21, which are arranged in this order.

The recoiler 300 may wind the multilayer circuit board 1 that has passes through the compressing machine 200. Here, the recoiler 300 may be the same as or similar to that illustrated in FIGS. 1 and 2, and thus, detailed descriptions thereof will be omitted.

The multilayer circuit board manufacturing apparatus 1000 may include a curing device 400-2. Here, the curing device 400-2 may include an unwinding roller 410-2, a heating unit 430-2, and a winding roller 420-2. The unwinding roller 410-2 may have the multilayer circuit board 1 wound around the recoiler 300 and supply the multilayer circuit board 1 to the heating unit 430-2. Here, the unwinding roller 410-2 may have a structure in which the recoiler 300 itself is disposed. The heating unit 430-2 may apply heat to the multilayer circuit board 1 that is supplied from the unwinding roller 410-2. Here, the heating unit 430-2 may include a heating chamber 431-2 and a heating portion 432-2 which are arranged on the movement path of the multilayer circuit board 1 that is moving. In this case, the heating portion 432-2 may include a heater, a lamp that supplies infrared light, a nozzle that supplies hot wind, or the like. The winding roller 420-2 may wind the multilayer circuit board 1 that has passed through the heating unit 430-2. Here, the winding roller 420-2 may be connected to a separate driving unit, such as a motor, and may transfer the multilayer circuit board 1.

A method for manufacturing the multilayer circuit board 1 using the multilayer circuit board manufacturing apparatus 1000 mentioned above will be described in detail.

The uncoiler 100 may continuously supply materials. The central uncoiler 110 may continuously supply central material 10. In an embodiment, the central material 10 may include a core layer and a metal pattern. The core layer may include a first surface and a second surface which are opposite to each other. The metal pattern may include a first metal pattern disposed on the first surface and a second metal pattern disposed on the second surface.

The first uncoiler 140 may continuously supply the first material 21. The second uncoiler 150 may continuously supply the second material 22. In an embodiment, the first material 21 and the second material 22 may have the same substance.

The third uncoiler 120 may continuously supply the third material 31, and the fifth uncoiler 160 may continuously supply the fifth material 32. In an embodiment, the third material 31 and the fifth material 32 may have the same substance. The third material 31 and the fifth material 32 may include prepreg.

The fourth uncoiler 130 may continuously supply the fourth material 41, and the sixth uncoiler 170 may continuously supply the sixth material 42. In an embodiment, the fourth material 41 and the sixth material 42 may have the same substance. The fourth material 41 and the sixth material 42 may have copper foils.

Next, the compressing machine 200 may compress the plurality of materials which are fed into the compressing machine 200. Subsequently, the manufactured multilayer circuit board 1 may pass through the compressing machine 200. Therefore, according to the present embodiment, it is possible to manufacture the multilayer circuit board 1 with reduced appearance defects and improved product quality.

Next, the multilayer circuit board 1 disposed on the recoiler 300 may be disposed on the unwinding roller 410-2. Also, the multilayer circuit board 1 may be connected to the winding roller 420-2. When a driving unit of the winding roller 420-2 operates, the multilayer circuit board 1 may pass through the heating unit 430-2 while moving. The heating unit 430-2 may provide heat to the multilayer circuit board 1 and thus strengthen the coupling between the materials of the multilayer circuit board 1. In particular, the heating unit 430-2 may heat at least a portion of the third material 31 and heat at least portion of the fifth material 32.

The multilayer circuit board 1, which has passed through the heating unit 430-2, may be wound around the winding roller 420-2. Subsequently, the winding roller 420-2 moves to another device or the like, and various processes may be performed on the multilayer circuit board 1.

Figure 7:
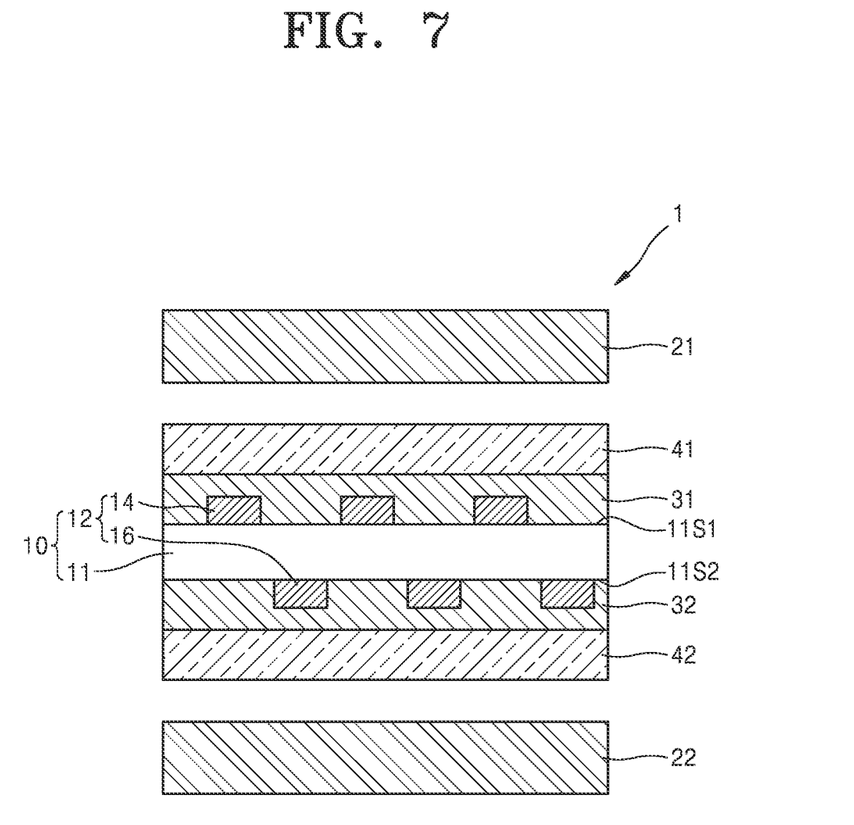
FIG. 7 is a cross-sectional view showing a multilayer circuit board according to another embodiment of the present disclosure.

FIG. 7 is a cross-sectional view showing a multilayer circuit board according to another embodiment of the present disclosure.

Referring to FIG. 7, the multilayer circuit board 1 may include the central material 10 and the plurality of materials. In an embodiment, the plurality of materials may include the central material 10, the first material 21, the second material 22, the third material 31, the fourth material 41, the fifth material 32, and the sixth material 42.

The second material 22, the sixth material 42, the fifth material 32, the central material 10, the third material 31, the fourth material 41, and the first material 21 may be disposed in this order in the multilayer circuit board 1. The multilayer circuit board 1 may be a circuit board which is manufactured for a component used for signal connection between electronic components in an electronic device.

The central material 10 may include a core layer 11 and a metal pattern 12. The core layer 11 may include a first surface 11S1 and a second surface 11S2. The second surface 11S2 may be a surface on the opposite side from the first surface 11S1. The metal pattern 12 may be disposed on at least one of the first surface 11S1 and the second surface 11S2. In an embodiment, the metal pattern 12 may include a first metal pattern 14 and a second metal pattern 16. The first metal pattern 14 may be disposed on the first surface 11S1. The second metal pattern 16 may be disposed on the second surface 11S2.

The third material 31 may cover the first metal pattern 14. The third material 31 may be disposed on the first surface 11S1 of the core layer 11 and the first metal pattern 14. The third material 31 may be prepreg. For example, the third material 31 may be formed by impregnating a glass cloth or a glass non-woven fabric with thermosetting resin and then semi-curing the impregnated material.

The fifth material 32 may cover the second metal pattern 16. The fifth material 32 may be disposed on the second surface 11S2 of the core layer 11 and the second metal pattern 16. The central material 10 may be disposed between the third material 31 and the fifth material 32. The third material 31 and the fifth material 32 may include the same substance. The fifth material 32 may be prepreg. For example, the fifth material 32 may be formed by impregnating a glass cloth or a glass non-woven fabric with thermosetting resin and then semi-curing the impregnated material.

The fourth material 41 may be disposed on the third material 31. In one embodiment, the fourth material 41 may be disposed on the side of the first surface 11S1 of the core layer 11. In one embodiment, the fourth material 41 may be a non-patterned metal thin plate having high conductivity, such as a copper foil.

The sixth material 42 may be disposed on the fifth material 32. In one embodiment, the sixth material 42 may be disposed on the side of the second surface 11S2 of the core layer 11. The central material 10, the third material 31, and the fifth material 32 may be disposed between the fourth material 41 and the sixth material 42. The sixth material 42 and the fourth material 41 may have the same substance. In some embodiments, the sixth material 42 may be a non-patterned metal thin plate having high conductivity, such as a copper foil.

The first material 21 may be disposed on the fourth material 41. The first material 21 may be a cover foil. In one embodiment, the first material 21 may be a carrier made of a copper foil. The second material 22 may be disposed on the sixth material 42. In one embodiment, the central material 10, the third material 31, the fourth material 41, the fifth material 32, and the sixth material 42 may be disposed between the first material 21 and the second material 22. In one embodiment, the second material 22 may be a carrier made of a copper foil. The first material 21 and the second material 22 may have the same substance.

The multilayer circuit board 1 as described above may have a structure in which composite materials are stacked. The first material 21 and the second material 22 may have the same substance and be arranged symmetrically. The third material 31 and the fifth material 32 may have the same substance and be arranged symmetrically. The fourth material 41 and the sixth material 42 may have the same substance and be arranged symmetrically.

The multilayer circuit board manufacturing apparatus and the multilayer circuit board manufacturing method according to embodiments of the present disclosure make it possible to continuously manufacture the multilayer circuit boards. Also, the multilayer circuit board manufacturing apparatus and the multilayer circuit board manufacturing method according to embodiments of the present disclosure may provide constant pressure and uniform temperature to the entire surface of the multilayer circuit board when the multilayer circuit board is manufactured.

Although the present disclosure has been described with reference to the above-mentioned embodiments, various modifications or variations are possible without departing from the subject matters and scope of the present disclosure. Therefore, the appended claims may include such modifications or variations as long as they belong to the subject matters of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A multilayer circuit board manufacturing apparatus comprising:
    a plurality of uncoilers configured to supply a plurality of different members; and
    a compressing machine configured to bond the members, which are supplied from the respective uncoilers, to each other,
    wherein the compressing machine comprises:
        a belt that rotates in contact with one surface of one of the plurality of members; and
        a pressing device including a fluid pressing unit configured to supply a fluid pressure on the belt, the fluid pressing unit being disposed inside the belt and spaced apart from the belt, and the fluid pressure presses the belt opposite from and toward the member in a non-contact manner.

2. The multilayer circuit board manufacturing apparatus of claim 1, wherein the compressing machine further comprises a belt roller which is located inside the belt and rotates the belt.

3. The multilayer circuit board manufacturing apparatus of claim 1, wherein the pressing device further comprises:
    a fluid outlet which is located adjacent to the fluid pressing unit and collects the fluid.

4. The multilayer circuit board manufacturing apparatus of claim 3, wherein the pressing device comprises a fluid inlet which is connected to the fluid pressing unit and guides the fluid to the fluid pressing unit.

5. The multilayer circuit board manufacturing apparatus of claim 4, wherein the fluid inlet is provided in plurality, and the plurality of fluid inlets are connected to the fluid pressing unit and spaced a certain distance from each other.

6. The multilayer circuit board manufacturing apparatus of claim 1, further comprising a recoiler configured to wind a multilayer circuit board in which the plurality of members passing through the compressing machine are laminated.

7. The multilayer circuit board manufacturing apparatus of claim 6, further comprising a curing device configured to cure the multilayer circuit board that is wound around the recoiler.

8. The multilayer circuit board manufacturing apparatus of claim 7, wherein the curing device comprises:
    an oven in which the multilayer circuit board wound around the recoiler is located;
    a support which is located inside the oven and supports the multilayer circuit board; and
    a heating section which is located in the oven and provides heat to the multilayer circuit board.

9. The multilayer circuit board manufacturing apparatus of claim 7, wherein the curing device comprises:
    an unwinding roller which the multilayer circuit board wound around the recoiler is disposed on and unwound from;
    a heating unit configured to heat the multilayer circuit board that is unwound from the unwinding roller; and
    a winding roller configured to wind the multilayer circuit board that has passed through the heating unit.

10. The multilayer circuit board manufacturing apparatus of claim 9, wherein the heating unit comprises:
 a heating chamber configured to provide a space in which the multilayer circuit board moves; and
 a heating portion which is located inside the heating chamber and heats the multilayer circuit board.

\* \* \* \* \*